(12) United States Patent
Goldie

(10) Patent No.: US 6,911,821 B2
(45) Date of Patent: Jun. 28, 2005

(54) GRADIENT COIL STRUCTURE FOR MAGNETIC RESONANCE IMAGING

(75) Inventor: Frederick Thomas David Goldie, Worthing (GB)

(73) Assignee: Tesla Engineering Ltd., Sussex (GB)

( * ) Notice: Subject to any disclaimer, the term of this patent is extended or adjusted under 35 U.S.C. 154(b) by 13 days.

(21) Appl. No.: 10/680,304

(22) Filed: Oct. 8, 2003

(65) Prior Publication Data
US 2004/0070472 A1 Apr. 15, 2004

(30) Foreign Application Priority Data
Oct. 10, 2002 (GB) .............................................. 0223684

(51) Int. Cl.⁷ .................................................. G01V 3/00
(52) U.S. Cl. ...................................... 324/318; 324/319
(58) Field of Search ................................ 324/318, 322, 324/319, 320, 309, 307, 300; 335/299

(56) References Cited

U.S. PATENT DOCUMENTS

| | | | |
|---|---|---|---|
| 5,512,828 A | 4/1996 | Pausch et al. | 324/309 |
| 5,886,548 A * | 3/1999 | Doty et al. | 324/318 |
| 5,939,882 A | 8/1999 | Gebhardt et al. | 324/318 |
| 5,942,898 A | 8/1999 | Petropoulos et al. | 324/318 |
| 5,959,454 A | 9/1999 | Westphal et al. | 324/320 |
| 6,154,110 A | 11/2000 | Takeshima | 335/299 |
| 6,441,616 B1 * | 8/2002 | Mansfield | 324/318 |

FOREIGN PATENT DOCUMENTS

| | | |
|---|---|---|
| EP | 0933645 A2 | 8/1999 |
| WO | WO 02/27345 A1 | 4/2002 |

* cited by examiner

Primary Examiner—Brij B. Shrivastav
(74) Attorney, Agent, or Firm—Nixon & Vanderhye P.C.

(57) ABSTRACT

A gradient coil structure for use in MRI apparatus has a main gradient coil 20 and a shielding coil 21, a portion of the shielding coil being disposed outwardly from the main coil. The coils are configured so that in a peripheral region 25 relative to the image region 22 the are almost coincident and the coils extend forwardly at an angle to the remainder of the main coil so that the main coil appears concave from the imaging region 22. This arrangement provides improved shielding efficiency.

5 Claims, 4 Drawing Sheets

Cross-section of bi-planar main gradient coil with conical shielding coil

Cross-section of conventional bi-planar gradient coil

Winding patterns of conventional bi-planar gradient coil (X axis)
(one out of four windings shown in each case)

Cross-section of bi-planar main gradient coil with conical shielding coil

Winding patterns of bi-planar main gradient coil with conical shielding coil (one of four for each), showing partial turns Cross-section of bi-planar main gradient coil
with conical shielding coil Winding patterns of concave main gradient coil with conical
shielding coil (one of four for each), showing partial turns.
Dotted line indicates near-coincident region

GRADIENT COIL STRUCTURE FOR MAGNETIC RESONANCE IMAGING

This invention relates to magnetic coil structures and in particular relates to gradient coil structures for use in magnetic resonance imaging and Spectroscopy (MRIS).

There are known MRIS systems which comprise a plurality of concentric coils which are located around a region within which a subject can be located. The coils include an outermost DC coil which is used to provide a strong constant magnetic field, an inner RF coil arrangement which is arranged concentrically within the DC coil, and a gradient coil assembly which is located between the inner RF and the outer DC coil. The gradient coil assembly is arranged to generate a time varying magnetic field which causes the response frequency and phase of the nuclei of the patient to depend upon their positions within the field.

Arrangements of this type are known where the coils are cylindrical. The gradient coil assemblies usually consist of a set of three coils referred to as the X, Y and Z gradient coils. An unshielded gradient may be formed by winding a pattern of conductors on the surface of a cylinder. Commonly however, each of the gradient coils is shielded by another pattern of conductors wound on another cylinder which surrounds the gradient coils.

More recently, alternative magnet geometries have been developed. In one such arrangement the magnet comprises two substantially distinct assemblies separated by a gap. The dominant magnetic field is generated between these assemblies and this type of configuration is commonly referred to as a transverse field magnet. The magnetic field may be generated by a permanent magnet, a resistive electromagnet or a superconducting magnet. The subject to be imaged is placed between the magnet assemblies. In such arrangements a cylindrical gradient coil configuration is no longer appropriate. A typical geometry of such a gradient coil comprises two substantially planar discs located above and below the subject being imaged. The discs can optionally incorporate additional shield windings.

Shielding coils for MRIS in transverse field configurations can be constructed substantially independently from the main coils which produce the homogeneous magnetic field. FIG. 1a shows a cross sectional view of a known configuration in which the shielding coils 10 are connected in series with the main coils 11 at a single pair of terminals. FIG. 1b shows the winding pattern for the main X gradient coil and the shielding coil. This configuration produces good shielding characteristics especially if the shielding coil is larger in diameter than the main coil. However, the arrangement results in a very large diameter assembly. The turns at the perimeter of the main coil and shield coil substantially cancel each other magnetically, but they are costly in terms of inductance and resistance; therefore the whole assembly is relatively inefficient.

It has been proposed to truncate the outer parts of such a coil configuration by in effect discarding the windings of each beyond a certain radius and linking many of the partial turns at the main coil so formed to the partial turns of the shielding coil. It has also been proposed to make the main coil planar and the shielding coils substantially concave or substantially conical when viewed from the imaging region. This type of known arrangement is illustrated in FIG. 2a of the drawings where the planar main coils are shown at 14 and the conical shielding coils at 15. FIG. 2b shows the winding patterns of the main gradient coil and the conical shielding coil. An arrangement of this type is described in WO 02/27345 and WO 02/27346.

This type of configuration results in a very compact coil. However, it involves a design compromise. As the shielding coil no longer extends beyond the main coil its effectiveness is reduced and substantial leakage fields can be created. These may induce eddy currents in conductive parts of the magnet. Such eddy currents may generate additional and deleterious time-varying magnet fields in the imaging region. Furthermore if the main magnetic field is produced by a superconducting coil, then the eddy currents may also generate dissipation in the cryogenic structure of the magnet thereby degrading its cryogenic performance.

The present invention has been developed in order to reduce these. problems.

According to the present invention there is provided a gradient coil structure for use in MRI apparatus, said coil structure comprising a main gradient coil and a shielding coil, said shielding coil having a portion thereof disposed outwardly from the main gradient coil and said coils being configured so that in a peripheral region relative to the imaging volume, the coils are almost coincident. Preferably some net current flows in the coils of the coincident region.

The coils in the coincident region may extend forwardly at an angle to the remainder of the main coil so that the main coil appears concave from the imaging volume. The shielding coil may be generally conical. The central region of the main coil may be planar and the angle between the coincident region and central region of the main coil may be obtuse.

Arrangements in accordance with the present invention provide improved shielding performance. Because of their near coincidence currents at the main and shielding coil become substantially interchangeable in the region of coincidence and current may be reassigned between the coils to meet manufacturing considerations.

The invention will be described now by way of example only with particular reference to the accompanying drawings.

In the drawings:

FIG. 1b is plan view showing the winding patterns of the main and shielding coils of FIG. 1a;

FIG. 2b is a view projected onto a plane showing the winding patterns of the main and shielding coils of FIG. 2a;

FIG. 3b is a view projected onto a plane showing the winding patterns of the main and shielding coil of FIG. 3a.

Figure 3A:
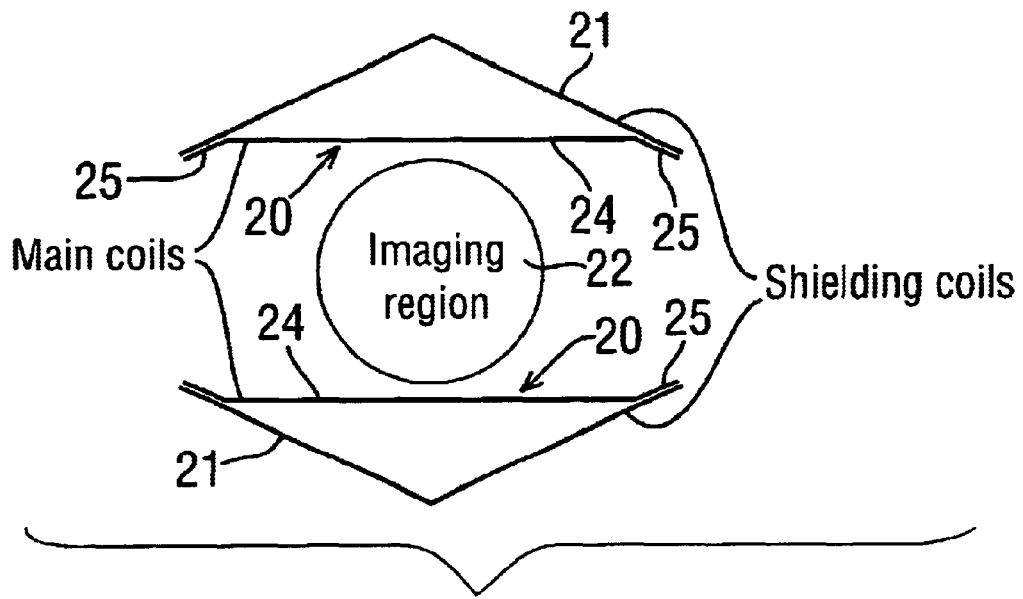
FIG. 3a is a cross sectional view of a gradient coil assembly in accordance with the present invention.
Figure 3B:
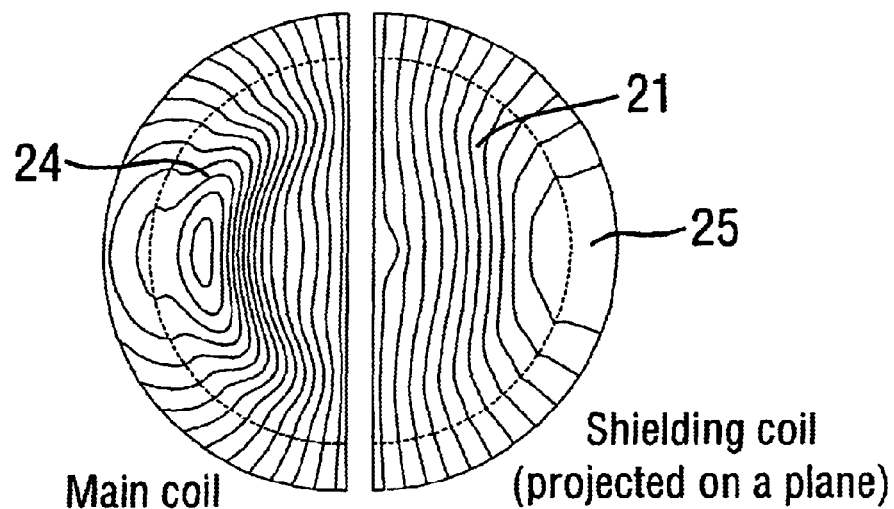

Referring to FIG. 3a, a gradient coil assembly in accordance with an embodiment of the present invention comprises a main coil 20 and a shielding coil 21. It will be appreciated that FIG. 3a in fact shows two gradient coil assemblies, one above and one below the imaging region 22. The main coil 20 has a central planar region 24 and a conically extending outer region 25. The gradient coil is generally conical and in its outer region is substantially coincident with the conical portion 25 of the main coil. The winding patterns for the main gradient coil and shielding coil are shown in FIG. 3b.

Thus, it can be seen that the shielding coil and the main coil are effectively jointly extended forward from the planar front face 24 of the main coil and are substantially coincident in this region 25. For optimal shielding some net current is required to flow in the extended region 25. Because of the near coincidence, the roles of the main coil and the shielding coil become effectively interchangeable in the extended region and current may be reassigned between the two coils as manufacturing conditions require.

The main and shielding coils are designed so that their respective conductors meet at the edges of extended region where they can be linked appropriately. It should be noted that the main coil is concave when viewed from the imaging region and the shielding coil is also concave but to a greater degree.

Figure 1A:
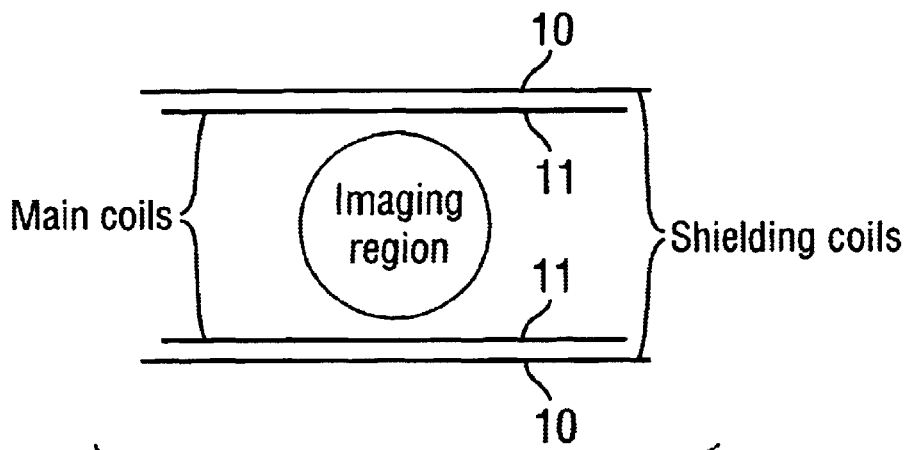
FIG. 1a is a cross sectional view of a known planar gradient coil assembly.
Figure 1B:
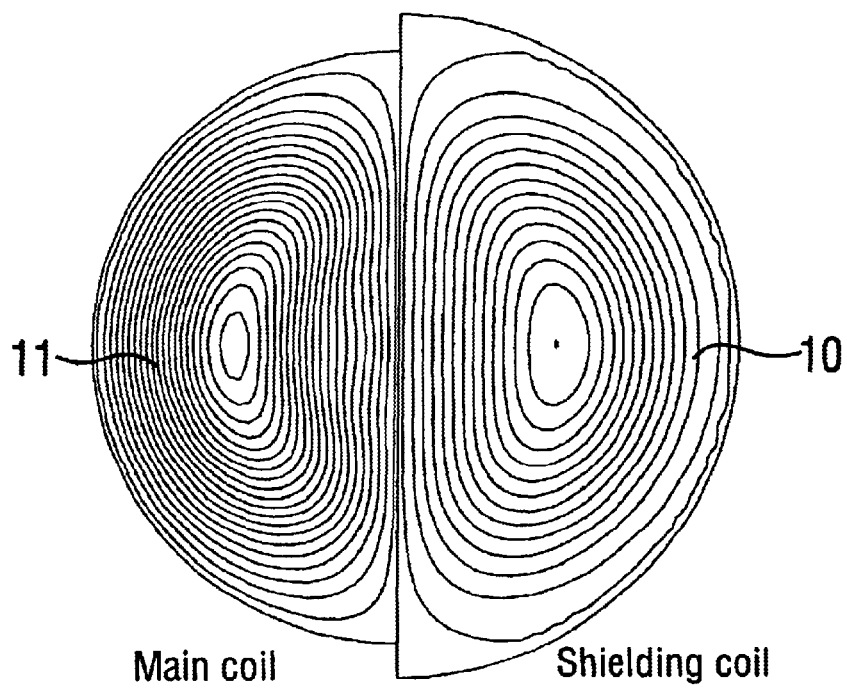
Figure 2A:
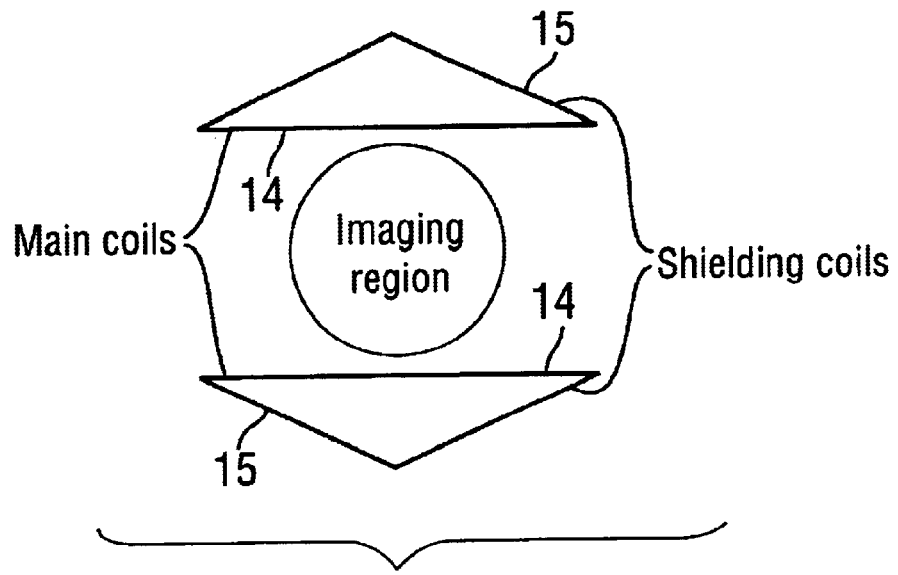
FIG. 2a is a cross sectional view of another know gradient coil assembly.
Figure 2B:
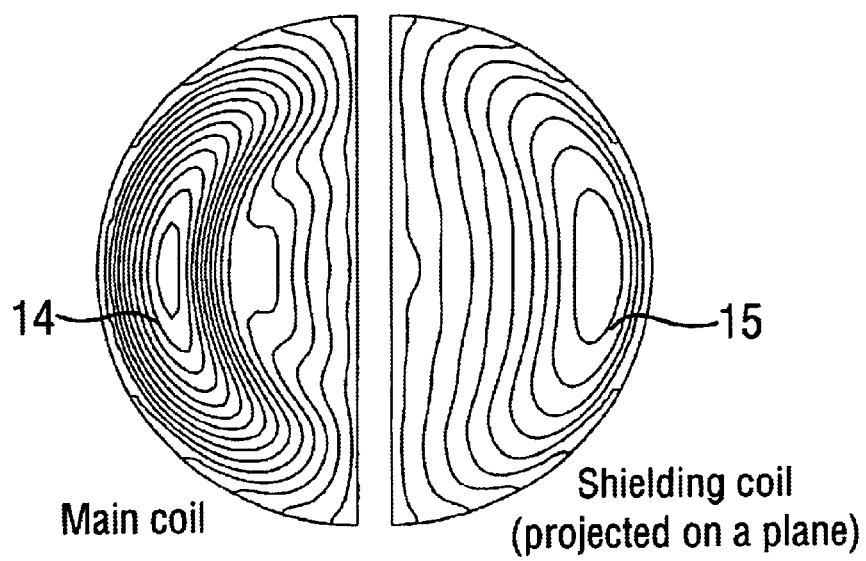

It has been found that relative to, for example, the prior art arrangement in FIG. 2, the configuration of FIG. 3 generates similar fields in the imaging region, but has substantially improved shielding efficiency. The leakage fields are reduced by up to a factor of 2 which will result in roughly a four-fold reduction in the contribution to cryogenic heat-load. It is also likely that image degradation due to eddy currents will be substantially reduced.

The assembly shown in FIG. 3 of the drawings is for the particular case of an X gradient assembly and its associated conical shielding coil. It will be appreciated by those skilled in the art that a Y gradient assembly would be of similar construction but rotated by 90° around the axis of the cone. It will also be appreciated that a Z gradient coil assembly can be constructed using similar principles, but in this case the conductors are substantially circular and coaxial with the cone.

Figure 4:
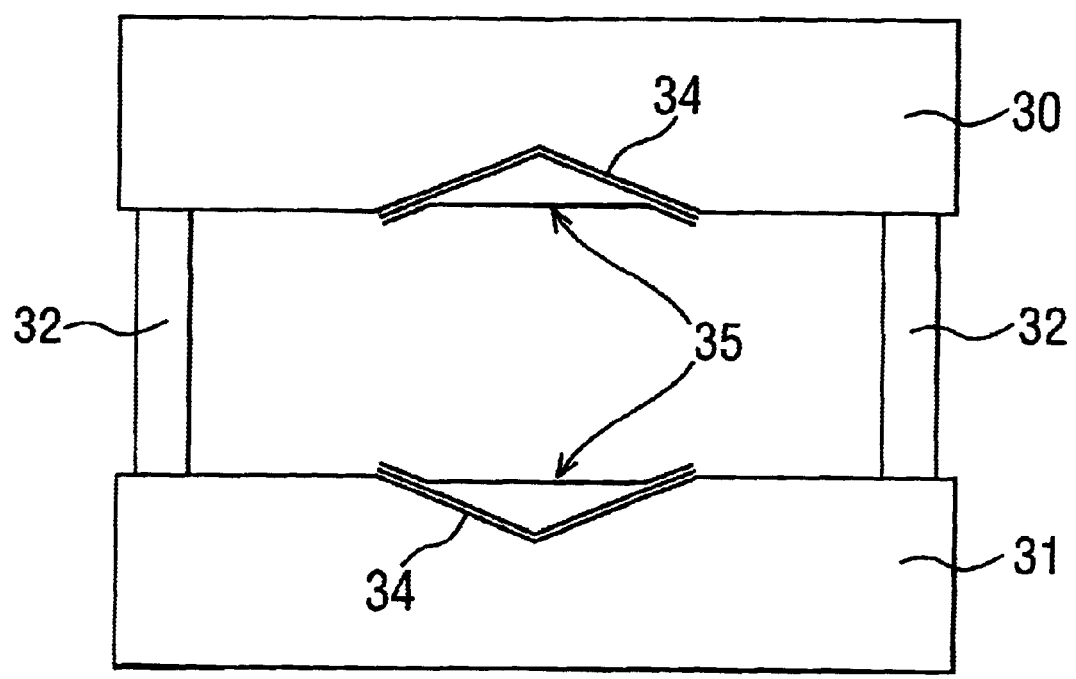
FIG. 4 is a schematic view illustrating an MRIS system incorporating a gradient coil assembly in accordance with the present invention.

FIG. 4 of the drawings illustrates how the X gradient coil assembly of FIG. 3 can be incorporated into an MRIS apparatus. In FIG. 4 the upper and lower magnet assemblies of an MRIS apparatus are shown at 30 and 31 with supports 32 extending therebetween. It will be appreciated that the assemblies 30 accommodate coils which generate the substantially homogeneous magnetic field required for MRIS together with the RF fields. Each magnet assembly 30, 31 has a conical shaped recess 34 which accommodates a gradient coil assembly 35 of the type described with reference to FIG. 3.

What is claimed is:

1. A gradient coil structure for use in MRI apparatus, said coil structure comprising a main gradient coil and a shielding coil, said shielding coil having a portion thereof disposed outwardly from the main gradient coil and said coils being configured so that in a peripheral region relative to the imaging volume, the coils are almost coincident, wherein, the coils in the coincident region extend forwardly at an angle to the remainder of the main coil so that the main coil appears concave from the imaging volume.

2. A gradient coil structure according to claim 1 wherein, in use, some net current flows in the coils of the coincident region.

3. A gradient coil structure according to claim 1 wherein the shielding coil is generally conical.

4. A gradient coil structure according to claim 1 wherein the central region of the main coil is planar and the angle between the coincident region and central region of the main coil is obtuse.

5. An MRIS apparatus including a gradient coil structure coil structure according to claim 1.

* * * * *